US008092984B2

(12) United States Patent
Teng

(10) Patent No.: US 8,092,984 B2
(45) Date of Patent: Jan. 10, 2012

(54) LITHOGRAPHIC PRINTING PLATE HAVING SPECIFIC POLYMERIC BINDERS

(76) Inventor: Gary Ganghui Teng, Northborough, MA (US)

( * ) Notice: Subject to any disclaimer, the term of this patent is extended or adjusted under 35 U.S.C. 154(b) by 727 days.

(21) Appl. No.: 12/203,119

(22) Filed: Sep. 2, 2008

(65) Prior Publication Data

US 2010/0055614 A1 Mar. 4, 2010

(51) Int. Cl.
*G03F 7/38* (2006.01)

(52) U.S. Cl. ...... 430/302; 430/944; 430/945; 430/281.1

(58) Field of Classification Search ........................ None
See application file for complete search history.

(56) References Cited

U.S. PATENT DOCUMENTS

| | | | | |
|---|---|---|---|---|
| 3,737,320 | A * | 6/1973 | Dietrich | 430/536 |
| 5,607,816 | A | 3/1997 | Fitzgerald et al. | 430/271.1 |
| 5,910,395 | A | 6/1999 | Li et al. | 430/302 |
| 6,153,356 | A | 11/2000 | Urano et al. | 430/281.1 |
| 6,232,038 | B1 | 5/2001 | Takasaki et al. | 430/281.1 |
| 6,238,831 | B1 * | 5/2001 | Hauck et al. | 430/49.1 |
| 6,309,792 | B1 | 10/2001 | Hauck et al. | 430/270.1 |
| 6,482,571 | B1 | 11/2002 | Teng | 430/302 |
| 6,576,401 | B2 | 6/2003 | Teng | 430/303 |
| 6,689,537 | B2 | 2/2004 | Urano et al. | 430/273.1 |
| 7,189,494 | B2 | 3/2007 | Knight et al. | 430/281.1 |
| 7,291,438 | B2 | 11/2007 | Sakurai et al. | 430/175 |
| 7,524,615 | B2 * | 4/2009 | Teng | 430/302 |
| 2003/0186165 | A1 | 10/2003 | Gries et al. | 430/281.1 |
| 2004/0229165 | A1 | 11/2004 | Munnelly et al. | 430/281.1 |
| 2005/0266349 | A1 | 12/2005 | Van Damme et al. | 430/300 |
| 2006/0046199 | A1 | 3/2006 | Mitsumoto et al. | 430/302 |
| 2007/0160936 | A1 * | 7/2007 | Gardner et al. | 430/311 |
| 2007/0172766 | A1 * | 7/2007 | Teng | 430/302 |
| 2007/0202443 | A1 | 8/2007 | Mitsumoto | 430/302 |

OTHER PUBLICATIONS

"alkaline", www.thefreedictionary.com, printed Jun. 20, 2011, 2 pages.*

* cited by examiner

*Primary Examiner* — Cynthia Hamilton

(57) ABSTRACT

Negative lithographic printing plate having on a substrate a photosensitive layer comprising an alkaline soluble polymeric binder, an alkaline insoluble polymeric binder, a polymerizable monomer, and an initiator is described. The photosensitive layer is imagewise exposed with a radiation to cause hardening in the exposed areas, and then developed to remove the non-hardened areas. The combination of both alkaline soluble polymeric binder and alkaline insoluble polymeric binder in a photosensitive layer can give excellent combined durability, developability, and coatability.

13 Claims, No Drawings

LITHOGRAPHIC PRINTING PLATE HAVING SPECIFIC POLYMERIC BINDERS

FIELD OF THE INVENTION

This invention relates to lithographic printing plates. More particularly, it relates to lithographic printing plates having a photosensitive layer comprising both an alkaline soluble polymeric binder and an alkaline insoluble polymeric binder.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask that is placed between the light source and the plate. Laser sources have been increasingly used to imagewise expose a lithographic printing plate that is sensitized to a corresponding laser. This allows the elimination of the photomask film, reducing material, equipment and labor cost. Among the lasers useful are infrared lasers (about 830 nm or 1064 nm), FD-YAG laser (about 532 nm), violet laser (about 405 nm), and ultraviolet laser (such as about 375 nm).

The exposed plate is usually developed with a liquid developer such as an alkaline aqueous developer to bare the substrate in the non-hardened or solubilized areas. On-press developable lithographic printing plates have been introduced in recent years. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, 6,482,571, 6,737,220, 6,994,028, 6,969,575, and 6,949,327.

Photopolymerizable composition based lithographic plates (also called photopolymer plates) are very attractive because of the high durability of photopolymer plates. Examples of such plates are described in U.S. Pat. Nos. 5,607,816, 5,910,395, 6,153,356, 6,232,038, 6,482,571, 6,576,401, 6,881,532, 7,189,494 and 7,291,438, and U.S. Pat. App. Pub. Nos. 2003/0186165, 2004/0229165, 2005/0266349, 2006/0046199, and 2007/0202443. Such plate generally comprises on a substrate a photosensitive layer comprising a polymeric binder, a polymerizable monomer, and an initiator. For plate developed with alkaline developer, an alkaline soluble polymeric binder is generally used in the photosensitive layer, in order to achieve alkaline solubility. For plate developed with non-alkaline developer, an alkaline insoluble polymeric binder is generally used, because alkaline insoluble polymeric binder generally gives better durability (than an alkaline soluble polymeric binder with similar backbone structure). The combination of both alkaline soluble polymeric binder and alkaline insoluble polymeric binder in the photosensitive layer is not expected because of the contradicting properties as mentioned above.

The inventor has found, surprisingly, photopolymer lithographic plates having both alkaline soluble polymeric binder and alkaline insoluble polymeric binder can give excellent combined durability, developability and coatability. Such combined properties are desirable for the manufacture and use of lithographic plates.

SUMMARY OF THE INVENTION

According to the present invention, there has been provided a lithographic printing plate comprising on a substrate a photosensitive layer comprising an alkaline soluble polymeric binder, an alkaline insoluble polymeric binder, a polymerizable monomer, and an initiator; wherein said photosensitive layer is capable of hardening upon exposure to a radiation having a wavelength selected from 200 to 1200 nm.

Preferably, said photosensitive layer further comprises a sensitizing dye. Said alkaline soluble polymeric binder preferably comprises both (meth)acrylate units and (meth)acrylic acid units in the main chain (more preferably with an acid number of at least 40 mg KOH/g), and said alkaline insoluble polymeric binder preferably comprises (meth)acrylate units in the main chain (more preferably with an acid number of less than 35 mg KOH/g). An overcoat (more preferably a water soluble or dispersible overcoat) is preferably coated on the photosensitive layer. The plate is preferably a wet plate having a hydrophilic substrate and an oleophilic photosensitive layer.

According to another aspect of the present invention, there has been provided a method of (i) exposing the above plate with a radiation having a wavelength selected from 200 to 1200 nm to cause hardening of the photosensitive layer in the exposed areas and then (ii) developing said exposed plate to remove the non-hardened areas of the photosensitive layer. The plate is preferably developed with an aqueous developer, with ink and/or fountain solution, or with an oleophilic paste and/or an aqueous solution. The radiation is preferably a laser having a wavelength selected from 200 to 1200 nm, more preferably an infrared laser having a wavelength selected from 750 to 1200 nm or a violet or ultraviolet laser having a wavelength selected from 200 to 430 nm.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric support. A surface coating may be coated to achieve desired surface properties. For wet plate, the substrate should have a hydrophilic surface (for oleophilic photosensitive layer) or oleophilic surface (for hydrophilic photosensitive layer);

preferably, a wet lithographic plate has a hydrophilic substrate and an oleophilic photosensitive layer. For waterless plate, the substrate should have an oleophilic surface (for oleophobic photosensitive layer) or oleophobic surface (for oleophilic photosensitive layer).

Particularly suitable hydrophilic substrate for a wet lithographic plate is an aluminum support that has been grained and anodized, preferably with further hydrophilic treatment. Surface graining can be achieved by mechanical graining or brushing, chemical etching, and/or AC electrochemical graining. The grained aluminum is typically treated with a basic or acidic solution to remove the smut, and then subjected to an electrochemical anodization process utilizing an acid such as sulfuric acid and/or phosphoric acid. The roughened and anodized aluminum surface can be further treated with a hydrophilic material to form a hydrophilic barrier layer. Suitable hydrophilic materials include metal silicate such as sodium silicate, phosphate fluoride (formed from a solution containing phosphate and fluoride such as sodium dihydrogen phosphate and sodium fluoride), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred hydrophilic polymers. The hydrophilic material can be formed on the aluminum surface by thermal or electrochemical method. By thermal method, the grained and anodized aluminum passes through or is immersed for a certain time in a solution containing the hydrophilic material at a certain temperature including elevated and room temperature, preferably at an elevated temperature between 40 and 99° C. By electrochemical method, a DC or AC electricity is applied to the aluminum while passing through or immersed in the solution containing the hydrophilic material. Processes for surface graining, anodization, and hydrophilic treatment of aluminum in lithographic printing plate application are well known in the art, and examples can be found in U.S. Pat. Nos. 2,714,066, 4,153,461, 4,399,021, 5,368,974, and 6,555,205.

The photosensitive layer of this invention comprises an alkaline soluble polymeric binder, an alkaline insoluble polymeric binder, a polymerizable monomer, and an initiator. A sensitizing dye (such as an infrared laser absorbing dye or a violet laser sensitizing dye) is preferably added. The monomer is preferably a free radical polymerizable monomer, and the initiator is preferably a free radical initiator. Various additives such as surfactant, stabilizer, dye, pigment, and exposure-indicating dye can be added. Said photosensitive layer is capable of hardening upon exposure to a radiation having a wavelength selected from 200 to 1200 nm. Here hardening means becoming insoluble and non-dispersible in a developing material (such as an aqueous developer, ink and/or fountain solution, or an oleophilic paste and/or an aqueous solution). The photosensitive layer in the non-hardened areas is capable of removal with the developing material, while the photosensitive layer in the hardened areas is incapable of removal with the developing material. The weight ratio of the alkaline soluble polymeric binder (including all the alkaline soluble polymeric binders if more than one such binders present) to the alkaline insoluble polymeric binder (including all the alkaline insoluble polymeric binders if more than one such binders present) is from 0.05 to 9.5, preferably from 0.10 to 10, more preferably from 0.20 to 5.0, and most preferably from 0.30 to 3.0. The weight ratio of all the monomers having at least 3 (meth)acrylate groups to all the polymeric binders is preferably at least 0.5, more preferably from 1.0 to 6.0, even more preferably from 1.5 to 5.0, and most preferably from 2.0 to 4.0. The radiation can be a conventional light such as ultraviolet light from a lamp or can be a laser. Preferably, the photosensitive layer is sensitive to a laser and exposed with such laser. The photosensitive layer preferably has a coverage of from 100 to 4000 mg/$m^2$, and more preferably from 400 to 2000 mg/$m^2$.

In this patent, the term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups).

Alkaline soluble polymeric binder suitable for the photosensitive layer of this invention can be any solid film-forming polymer which is soluble in an alkaline aqueous solution free of organic solvent and with a pH of from 9.0 to 13.5 and which is insoluble in pure water (with a pH of 7.0). The polymer may or may not have (meth)acrylate groups or other ethylenic groups (such as allyl groups). Examples of suitable alkaline soluble polymeric binders include copolymer of (meth) acrylic acid and (meth)acrylate (such as copolymer of methyl methacrylate and methyl methacrylic acid, and copolymer of allyl methacrylate and acrylic acid), styrene/methacrylic acid copolymer, partial ester of styrene/maleic anhydride copolymer, and polyurethane binder containing carboxylic acid groups. Preferred alkaline soluble polymeric binder is one which comprises both (meth)acrylate units and (meth)acrylic acid units in the main chain (such as a copolymer of methyl methacrylate and methacrylic acid, or a copolymer of methyl acrylate, methacrylic acid and styrene). More preferred alkaline soluble polymeric binder is one which comprises primarily (meth)acrylate units and (meth)acrylic acid units in the main chain, with no or less than 10% (by main chain monomer units) of other monomer units in the main chain (such as a copolymer of methyl methacrylate and methacrylic acid, or a copolymer of methyl acrylate, methacrylic acid and allyl acrylate). The alkaline soluble polymeric binder preferably has an acid number of at least 40 mg KOH/g, more preferably at least 60 mg KOH/g, and most preferably at least 80 mg KOH/g.

Alkaline insoluble polymeric binder suitable for the photosensitive layer of this invention can be any solid film-forming polymer which is insoluble in any alkaline aqueous solution free of organic solvent and with a pH of from 9.0 to 13.5. (It is noted that addition of certain organic solvent in an aqueous solution may increase or enable the solubility of the polymer in such solution, so an alkaline insoluble polymeric binder may be soluble in an aqueous solution with addition of certain organic solvent.) The polymer may or may not have (methacrylate groups or other ethylenic groups (such as allyl groups). Examples of suitable alkaline insoluble polymeric binders include (meth)acrylic polymers and copolymers (such as polybutylmethacrylate, polymethylmethacrylate, polymethylmethacrylate, polymethylacrylate, butylmethacrylate/methylmethacrylate copolymer, and polyallylmethacrylate), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. Preferred alkaline insoluble polymeric binder is one which comprises (meth) acrylate units in the main chain (such as polymethylmethacrylate, a copolymer of methyl methacrylate and butyl acrylate, or a copolymer of styrene and methyl methacrylate). More preferred alkaline insoluble polymeric binder is one which comprises primarily (meth)acrylate units in the main chain, with no or less than 10% (by main chain monomer units) of other monomer units in the main chain (such as a copolymer of methyl methacrylate and butyl methacrylate, polymethylmethacrylate, a copolymer of methyl methacrylate and allyl acrylate, or a copolymer of methyl methacrylate and methacrylic acid with a monomer unit ratio of 98 to 2). The alkaline insoluble polymeric binder is preferably free of carboxylic acid group or having lower concentration of carboxylic acid group. The alkaline insoluble polymeric binder preferably has an acid number of lower than 35 mg KOH/g, more preferably lower than 20 mg KOH/g and most preferably lower than 10 mg KOH/g.

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth) acrylate; and oligomeric amine (meth)acrylates. The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth) acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatophenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyanate isocyanurate trimer. Suitable (meth)acrylate compounds with one hydroxy group include pentaerythritol tri(meth)acrylate, dipentaerythritol penta(meth)acrylate, ditrimethylolpropane tri (meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane) tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis($\eta^9$-2,4-cyclopentadien-1-yl)bis[2,6-difluoro-3-(1H-pyrrol-1-yl)phenyl)titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the infrared sensitive photosensitive layer (also called thermosensitive layer) of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitive dyes include, for example, cyanine dyes; rhodamine compounds such as rhodamine 6G perchloride; chromanone compounds such as 4-diethylaminobenzylidene chromanone; dialkylaminobenzene compounds such as ethyl 4-dimethylaminobenzoate and dialkylaminobenzene; dialkylaminobenzophenone compounds such as 4,4'-bis(dimethylamino) benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-dimethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl) pyridine, 2-(p-dimethylaminophenyl)quinoline, 2-p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet sensitizing dye is added in the photosensitive layer preferably at 0.1 to 20% by weight of the photosensitive layer, more preferably 0.5 to 15%, and most preferably 1 to 10%.

The free radical polymerizable photosensitive layer of the present invention preferably contains one or more hydrogen donors as polymerization accelerator. Examples of the hydrogen donors include compounds having a mercapto group (also called mercapto compounds) such as 2-mercaptobenzoxazole, 2-mercaptobenzothiazole, 2-mercaptobenzimidazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzoxazole, 2-mercaptobenzothiazole, 2-mercaptobenzimidazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is added in the photosensitive layer preferably at 0.01 to 15% by weight of the photosensitive layer, more preferably 0.1 to 10%, and most preferably 0.5 to 5%.

Various surfactants can be added into the photosensitive layer to, for example, improve the coatability or developability. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 15% by weight of the photosensitive layer, and more preferably from 0.5 to 5%.

The photosensitive layer may be conformally coated onto a roughened substrate (for example, with Ra of larger than 0.4 microns) at thin coverage (for example, of less than 1.2 $g/m^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

For plates with rough and/or porous surface, a thin water-soluble interlayer may be deposited between the substrate and the photosensitive layer. Preferably, the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is a preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 $mg/m^2$, more preferably 2 to 100 mg/$m^2$, and most preferably 4 to 40 mg/$m^2$. The substrate preferably has an average surface roughness Ra of 0.2 to 2.0 microns, and more preferably 0.4 to 1.0 microns.

The lithographic plate of this invention preferably comprises an overcoat (also called protective layer) on the photosensitive layer, to, for example, enhance the photospeed (by reducing oxygen inhibition), enhance handling capability, and/or improve shelflife stability. The overcoat can be any film-forming material that is developable with a regular liquid developer (such as an aqueous developer) or a developing fluid (such as ink and/or fountain solution, for on-press developable plate) or is removable with water or other solution. The overcoat is preferably removable with water, an organic solvent, or with ink and/or fountain solution; more preferably with water or with ink and/or fountain solution. For aqueous developable plate, the overcoat is preferably water soluble or dispersible. For on-press ink and/or fountain solution developable plate, as well as for plate developable off press with ink and/or fountain solution or with an oleophilic paste and/or an aqueous solution, the overcoat is preferably soluble or dispersible in ink and/or fountain solution; more preferably soluble or dispersible in water. For plate developable with a regular liquid developer, the overcoat preferably has a coverage of from 0.1 to 5.0 g/$m^2$, more preferably from 0.5 to 3.0 g/$m^2$, and most preferably from 1.0 to 2.0 g/$m^2$. For plate developable on press with ink and/or fountain solution, or developable off press with ink and/or fountain solution or with an oleophilic paste and/or aqueous solution, the overcoat preferably has a coverage of from 0.001 to 2.0 g/$m^2$, more preferably from 0.01 to 1.0 g/$m^2$, and most preferably from 0.05 to 0.5 g/$m^2$.

The water soluble or dispersible overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate.

The photosensitive layer is capable of hardening upon exposure to a radiation selected from 200 to 1200 nm. The radiation is preferably a laser. Depending on the sensitizing dye or the initiator, the photosensitive layer can be sensitized to a different laser, such as an infrared laser having a wavelength selected from 750 to 1200 nm, a visible laser having a wavelength selected from 390 to 600 nm, a violet laser having a wavelength selected from 390 to 430 nm (which is also a visible laser), or an ultraviolet laser having a wavelength selected from 200 to 390 nm. The plate is preferably sensitized to an infrared laser or a violet or ultraviolet laser. A photosensitive layer sensitive to an infrared laser is also called a thermosensitive layer, and likewise a plate sensitive to an infrared laser is also called a thermosensitive plate.

In a preferred embodiment for the thermosensitive (infrared laser sensitive) lithographic plate of this invention, the thermosensitive layer comprises an alkaline soluble polymeric binder, an alkaline insoluble polymeric binder, a polymerizable ethylenically unsaturated monomer having at least one terminal ethylenic group, a free-radical initiator, and an infrared absorbing dye. Other additives such as surfactant, dye (regular coloring dye), pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer preferably is a compound having at least 2 (meth)acrylate groups, more preferably at least 3 (meth)acrylate groups, and most preferably at least 4 (meth) acrylate groups. Combination of both urethane (meth)acrylate monomer and non-urethane (meth)acrylate monomer can be advantageously used. The weight ratio of all the alkaline soluble polymeric binders to all the alkaline insoluble polymeric binder is preferably from 0.10 to 10, more preferably from 0.20 to 5.0, and most preferably from 0.30 to 3.0. The weight ratio of all the monomers having at least 3 (meth) acrylate groups to all the polymeric binders is preferably at least 0.5, more preferably from 1.0 to 6.0, even more preferably from 1.5 to 5.0, and most preferably from 2.0 to 4.0. The plate preferably further comprises a water soluble or dispersible overcoat on the photosensitive layer.

In a preferred embodiment for visible laser sensitive lithographic plate of this invention, the photosensitive layer comprises an alkaline soluble polymeric binder, an alkaline insoluble polymeric binder, a polymerizable ethylenically unsaturated monomer having at least one terminal ethylenic group, a free-radical initiator, and a visible sensitizing dye. A hydrogen donor is preferably added to increase the photospeed. Other additives such as surfactant, dye, pigment, exposure-indicating dye, and free-radical stabilizer may be added. The plate preferably further comprises a water soluble or dispersible overcoat on the photosensitive layer.

In a preferred embodiment for violet or ultraviolet laser sensitive lithographic plate of this invention, the photosensitive layer comprises an alkaline soluble polymeric binder, an alkaline insoluble polymeric binder, a polymerizable ethylenically unsaturated monomer having at least one terminal ethylenic group, a free-radical initiator, and a violet or ultraviolet sensitizing dye. A hydrogen donor is preferably added to increase the photospeed. Other additives such as surfactant, dye, pigment, exposure-indicating dye, and free-radical stabilizer may be added. The initiator is preferably a hexaarylbiimidazole compound or a titanocene compound, more preferably a hexaarylbiimidazole compound. A preferred sensitizing dye is a dialkylaminobenzophenone compound, preferably a 4,4'-bis(dialkylamino)benzophenone compound. The monomer preferably is a compound having at least 2 (meth)acrylate groups, more preferably at least 3 (meth)acrylate groups, and most preferably at least 4 (meth) acrylate groups. Combination of both urethane (meth)acrylate monomer and non-urethane (meth)acrylate monomer can be advantageously used. The weight ratio of all the alkaline soluble polymeric binders to all the alkaline insoluble polymeric binder is preferably from 0.10 to 10, more preferably from 0.20 to 5.0, and most preferably from 0.30 to 3.0. The weight ratio of all the monomers having at least 3 (meth) acrylate groups to all the polymeric binders is preferably at least 0.5, more preferably from 1.0 to 6.0, even more preferably from 1.5 to 5.0, and most preferably from 2.0 to 4.0. The plate preferably further comprises a water soluble or dispersible overcoat on the photosensitive layer.

A preferred alkaline developable lithographic plate of this invention comprises on a substrate a photosensitive layer comprising an alkaline soluble polymeric binder, an alkaline insoluble polymeric binder, a polymerizable monomer, an initiator, and a sensitizing dye; wherein the photosensitive layer is soluble or dispersible in an alkaline aqueous developer having a pH of at least 9.0, preferably from 10.0 to 13.5, more preferably from 11.0 to 13.0. A pigment is preferably added. Various additives, such as surfactant, dye and stabilizer, can be added. The monomer is preferably a free radical polymerizable monomer having at least 2 (meth)acrylate groups, more preferably at least 3 (meth)acrylate groups, and most preferably at least 4 (meth)acrylate groups; and the initiator is preferably a free radical initiator. Urethane monomer with at least 4 (meth)acrylate groups can be advantageously used in the photosensitive layer. Combination of a urethane monomer with at least 4 (meth)acrylate groups and a non-urethane monomer with at least 4 (meth)acrylate groups can be more advantageously used in the photosensitive layer. The weight ratio of all the monomers having at least 3 (meth)acrylate groups to all the polymeric binders is preferably at least 0.5, more preferably from 1.0 to 6.0, even more preferably from 1.5 to 5.0, and most preferably from 2.0 to 4.0.

A preferred non-alkaline aqueous developable lithographic plate of this invention comprises on a substrate a photosensitive layer comprising an alkaline soluble polymeric binder, an alkaline insoluble polymeric binder, a polymerizable monomer, an initiator, and a sensitizing dye; wherein the photosensitive layer is soluble or dispersible in a non-alkaline aqueous developer with a pH of from 1.0 to 8.0, preferably from 3.0 to 7.0. A nonionic surfactant is preferably added. A pigment is also preferably added. Various additives, such as ionic surfactant, dye and stabilizer, can be added. The monomer is preferably a free radical polymerizable monomer having at least 2 (meth)acrylate groups, more preferably at least 3 (meth)acrylate groups, and most preferably at least 4 (meth)acrylate groups; and the initiator is preferably a free radical initiator. Urethane monomer with at least 4 (meth) acrylate groups can be advantageously used in the photosensitive layer. Combination of a urethane monomer with at least 4 (meth)acrylate groups and a non-urethane monomer with at least 4 (meth)acrylate groups can be more advantageously used in the photosensitive layer. The weight ratio of all the monomers having at least 3 (meth)acrylate groups to all the polymeric binders is preferably at least 0.5, more preferably from 1.0 to 6.0, even more preferably from 1.5 to 5.0, and most preferably from 2.0 to 4.0.

A preferred lithographic plate suitable for on-press development with ink and/or fountain solution, or for off-press development with ink and/or fountain solution or with an oleophilic paste (including liquid) and/or an aqueous solution (including water), of this invention comprises on a substrate a photosensitive layer comprising an alkaline soluble polymeric binder, an alkaline insoluble polymeric binder, a polymerizable monomer, an initiator, and a sensitizing dye; wherein the photosensitive layer is soluble or dispersible in ink and/or fountain solution and on-press removable with ink and/or fountain solution. Preferably, the photosensitive layer is softenable with ink and on-press removable with both ink and fountain solution. A nonionic surfactant is preferably added. The monomer is preferably a free radical polymerizable monomer having at least 2 (meth)acrylate groups, more preferably at least 3 (meth)acrylate groups, and most preferably at least 4 (meth)acrylate groups; and the initiator is preferably a free radical initiator. Urethane monomer with at least 4 (meth)acrylate groups can be advantageously used in the photosensitive layer. Combination of a urethane monomer with at least 4 (meth)acrylate groups and a non-urethane monomer with at least 4 (meth)acrylate groups can be more advantageously used in the photosensitive layer. The weight ratio of all the monomers having at least 3 (meth)acrylate groups to all the polymeric binders is preferably at least 1.0, more preferably from 1.5 to 6.0, and most preferably from 2.0 to 4.0.

The violet or ultraviolet sensitive lithographic plates and photosensitive compositions as described in U.S. patent application Ser. Nos. 11/651,319 and 11/638,932, the entire disclosures of which are hereby incorporated by reference, can be used for the instant invention.

A hydrophilic or oleophilic micro particles may be added into the photosensitive layer to enhance, for example, the developability and non-tackiness of the plate. Suitable micro particles include polymer particles, talc, titanium dioxide, barium sulfate, silicone oxide and aluminum micro particles, with an average particle size of less than 10 microns, preferably less than 5 microns, more preferably less than 2 microns and most preferably less than 1 microns.

The photosensitive layer should exhibit an affinity or aversion substantially opposite to the affinity or aversion of the substrate to at least one printing liquid selected from the group consisting of ink and an adhesive fluid for ink. For example, a wet plate can have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An adhesive fluid for ink is a fluid that repels ink. Fountain solution is the most commonly used adhesive fluid for ink. A wet plate is printed on a wet press equipped with both ink and fountain solution, while a waterless plate is printed on a waterless press equipped with ink. Preferably, the plate has an oleophilic photosensitive layer on a hydrophilic substrate.

The photosensitive layer is preferably coated onto the substrate from a solution comprising all the components of said photosensitive layer dissolved or dispersed in a solvent (including blend of solvents). The solvent is preferably an organic solvent (including blend of organic solvents). All the components of said photosensitive layer, other than the pigment if any which is in the form of dispersed particles, are preferably dissolved in the solvent in the solution. The solution containing the photosensitive layer can be coated onto the substrate, followed by drying to remove the solvent, to form the photosensitive layer. It can be coated by any means, such as by roller coater, slot coater, curtain coater, Mayer rod coater, or dip coater; preferably by roller coater or slot coater. The drying can be performed by any means, such as forced air, radiation (to the front and/or back of the plate), hot plate on the back of the plate, forced hot air, combination of forced air and radiation; preferably by forced hot air, infrared radiation, or combination of forced air and infrared radiation; more preferably by forced hot air or combination of forced (hot or ambient) air and infrared radiation (from front and/or back of the plate).

Infrared lasers useful for the imagewise exposure of the thermosensitive plates of this invention include laser sources emitting in the near infrared region, i.e., emitting in the wavelength range of from 750 to 1200 nm, and preferably from 800 to 1100 nm. Particularly preferred infrared laser sources are laser diodes emitting around 830 nm or a Nd/YAG laser emitting around 1060 nm. The plate is exposed at a laser dosage that is sufficient to cause hardening in the exposed areas but not high enough to cause substantial thermal ablation. The exposure dosage is preferably from 1 to 1000 $mJ/cm^2$, more preferably from 10 to 500 $mJ/cm^2$, and most preferably from 50 to 200 $mJ/cm^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively lower cost. The exposure dosage is preferably from 0.001 to 1 $mJ/cm^2$ (1 to 11000 $\mu J/cm^2$), more preferably from 0.005 to 0.5 $mJ/cm^2$ (5 to 500 $\mu J/cm^2$), and most preferably from 0.02 to 0.20 $mJ/cm^2$ (20 to 200 $\mu J/cm^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.001 to 1 $mJ/cm^2$ (1 to 1000 $\mu J/cm^2$), more preferably from 0.005 to 0.5 $mJ/cm^2$ (5 to 500 $\mu J/cm^2$), and most preferably from 0.02 to 0.20 $mJ/cm^2$ (20 to 200 $\mu J/cm^2$), depending on the sensitivity of the photosensitive layer.

Among the visible and ultraviolet lasers, violet or ultraviolet laser (with a wavelength selected from 200 to 430 nm) is particularly useful, and violet laser (with a wavelength selected from 390 to 430 nm) is even more useful.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The plate is usually supplied as sheets, preferably in a pre-cut size suitable for mounting on the press to be printed with. The plates in sheets are preferably packaged in a light-tight wrapping paper or bag within a box for shipping and storage. The plate taken out of the light-tight package is preferably mounted onto the exposure device (or press, for on-press exposure) within 30 minutes, more preferably within 5 minutes, and most preferably within 2 minutes, in order to avoid prolonged exposure to the room light which is preferably a yellow-red room light. Such plates can also be packaged in a cassette, preferably a light-tight cassette, so that the plate can be automatically loaded onto the plate cylinder of the press. Optionally, an interleaf can be placed between plates in the package to, for example, prevent plates from sticking to each other or from damaging to the coating. For interleaved plates stacked in a loading device or cassette for automatic loading, the interleaf on top of the stack is preferably automatically removed before automatically transferring the plate from top of the stack to said exposure device. The interleaf useful in this invention can be any flexible sheet material, such as regular paper, treated paper (for anti-sticking), wax treated paper, silicone treated paper, or plastic foil. The interleaf is preferably a paper, more preferably a treated paper, and most preferably wax or silicone treated paper.

For plate developable with a regular liquid developer, any liquid developer is suitable which can effectively remove the non-exposed areas of the photosensitive layer. Preferred are aqueous developers, which include alkaline aqueous developers and non-alkaline aqueous developers.

The non-alkaline aqueous developer (as defined in this application) comprises 60-99% by weight of water and has a pH of from 1.0 to 8.0, preferably 2.0 to 7.5, and more preferably 3.0 to 7.0. A surfactant is preferably added. An alcohol solvent is also preferably added. The alcohol solvent is defined as a water-soluble liquid organic compound having at least one hydroxyl group. The alcohol solvent must be soluble in water at the added concentration. Liquid alkyl alcohol (including arylalkyl alcohol) and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The alcohol solvent is added preferably at 0.1 to 40% by weight of the developer, more preferably at 1 to 20% by weight of the developer, and most preferably at 2 to 10%. The surfactant useful for the non-alkaline developer of this invention can be ionic surfactant, nonionic surfactant or both. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.1 to 20% by weight of the developer, more preferably from 0.5 to 10%, and most preferably from 1 to 5%. Various other additives, such as defoamer, bactericide, dye or pigment, and substrate conditioner (such as gum arabic, and maltodextrin), can be added. Certain acid, such phosphoric acid or citric acid can be added to improve the hydrophilicity of the substrate. Certain salts, such as sodium chloride, monosodium phosphate, trisodium phosphate, potassium phosphate and ammonium sulfite, may be added to, for example, improve the hydrophilicity of the bared substrate.

The alkaline aqueous developer is an aqueous solution comprising 60-99% by weight of water, and 0.02 to 30%, preferably 0.1 to 20% and more preferably 0.5 to 10%, by weight of alkaline compound and having a pH of at least 9.0, preferably from 10.0 to 13.5, and more preferably from 11.0 to 13.0. More than one alkaline compound can be used. Suitable alkaline compounds include inorganic alkaline compounds such as potassium silicate, sodium silicate, potassium hydroxide, and sodium hydroxide, and organic amine compounds such as triethylamine, diethylamine, triethanolamine, and diethanolamine. One or more surfactants (ionic or nonionic or both) are preferably added. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.01 to 20% by weight of the developer, more preferably from 0.1 to 10%, and most preferably from 1 to 5%. Various other additives, such as defoamer, bactericide, dye or pigment, and substrate conditioner (such as gum arabic, and maltodextrin), can be added. Certain salts, such as sodium chloride, potassium phosphate and ammonium sulfite, may be added to, for example, improve the hydrophilicity of the bared substrate. One or more organic solvents, preferably water soluble organic solvents, can be added at 0.1 to 20% by weight of the developer. Preferably, no organic solvent is added.

For alkaline developable plate developed with a developing processor, the alkaline aqueous developer is preferably maintained to have the same developing strength and characteristics (for achieving the same result of the developed plate) by replenishing with the same developer or with a developer replenisher having higher pH. Preferably, the developer is replenished with a replenisher having higher pH. The replenisher preferably has a pH of at least 0.2 higher than the developer, more preferably at least 0.4 higher, and most preferably at least 0.6 higher. In addition to replacing the lost developer (in terms of volume) due to evaporation and development, it is preferred that a portion of the developer is replaced with the replenisher after certain amount of plate throughput and/or time in order to maintain the same developing strength. The developing processor can be replenished automatically or by hand, and preferably automatically. The developing processor can be programmed so that the replenisher is automatically added at certain times in a certain amount corresponding to the square footage of the plate developed, the usage time, and/or idle time of the processor; and the extra amount of the developer in the developer tank is drained off (for example, to a waster container) by overflow. Alternatively, the developing processor can be programmed so that the developer is automatically drained off at a certain amount corresponding to the square footage of plate developed, the usage time, and/or idle time of the processor; and the replenisher is automatically added to replenish the developer by filling up the developer tank on the processor, including the developer lost during development and due to evaporation. Preferably, metered amount of the replenisher is pumped into the developing tank to replace about the same amount of the developer that drains off by overflow, periodically and according to the plate throughput. For a developing processor with a developer tank having about 20 to 30 liters of developer, the replenishing rate is preferably 10-300 ml/$m^2$ plate throughput and 2-300 ml/h for off hours and idle time, more preferably 20-200 ml/$m^2$ plate throughput and 10-150 ml/h for off hours and idle time, and most preferably 30-100 ml/$m^2$ plate throughput and 20-80 ml/h for off hours and idle time.

The developer replenisher for alkaline developable plate of this invention comprises an organic or inorganic alkaline compound, preferably an inorganic alkaline compound, more preferably an alkaline metal hydroxide compound, and most preferably sodium hydroxide or potassium hydroxide. The replenisher preferably further comprises a surfactant, more preferably a nonionic surfactant. Other additives, such as defoamer, dye or pigment, stabilizer, hydrophilization agent (such as gum Arabic), salt, stabilizer, and water-soluble organic solvent can be added. Preferably, no organic solvent is added.

In a particularly useful developer-replenisher system for alkaline developable plate of this invention, the developer comprises a first inorganic alkaline compound and the replenisher comprises a second inorganic alkaline compound, the first and the second inorganic alkaline compounds being the same or different; preferably, the developer comprises a first alkaline metal hydroxide compound and/or metal silicate compound and the replenisher comprises a second alkaline metal hydroxide compound and/or metal silicate compound, the first and the second alkaline metal hydroxide or metal silicate compounds being the same or different; more preferably, the developer comprises an alkaline metal hydroxide (preferably sodium hydroxide or potassium hydroxide) or metal silicate (preferably sodium silicate or potassium silicate), and the replenisher comprises sodium hydroxide or potassium hydroxide. In a preferred specific developer-replenisher system, the developer comprises a sodium silicate or potassium silicate, and the replenisher comprises a sodium hydroxide or potassium hydroxide. In a second preferred specific developer-replenisher system, both the developer and the replenisher comprises sodium silicate or potassium silicate. In a third preferred specific developer-replenisher system, both the developer and the replenisher comprise sodium hydroxide or potassium hydroxide. In a fourth preferred specific developer-replenisher system, both the developer and the replenisher comprise sodium hydroxide or potassium hydroxide, and both contain no more than 2.0% by weight of metal silicate, preferably no more than 1%, and more preferably no more than 0.5%, and most preferably no metal silicate. For developer comprising sodium hydroxide and/or potassium hydroxide, the concentration of the sodium hydroxide and potassium hydroxide is preferably from 0.02 to 2.0% by weight of the developer, more preferably from 0.04 to 1.0%, and most preferably from 0.1 to 0.5%. For replenisher comprising sodium hydroxide and/or potassium hydroxide, the concentration of the sodium hydroxide and potassium hydroxide is preferably at least 0.04% by weight of the replenisher, more preferably from 0.1 to 2.0%, and most preferably from 0.2 to 1.0%. It is noted that the concentration here is the total concentration of both sodium hydroxide and potassium hydroxide if both are present.

In a further particularly useful developer-replenisher system for alkaline developable plate of this invention, the developer comprises 0.02 to 10% by weight of a first inorganic alkaline compound, 0.1 to 15% by weight of a first surfactant, and 70 to 99% by weight of water; and said replenisher comprises 0.04 to 20% by weight of a second inorganic alkaline compound, 0.1 to 15% by weight of a second surfactant, and 70 to 99% by weight of water; the first and the second inorganic alkaline compounds are the same or different, and the first and the second surfactants are the same or different. The replenisher has a pH of at least 0.2 higher than the developer, preferably at least 0.4 higher, and more preferably at least 0.6 higher. In a first specific system, said first inorganic alkaline compound is sodium silicate or potassium silicate with a concentration of 0.5 to 10% by weight of the developer, and said second inorganic alkaline compound is sodium silicate or potassium silicate with a concentration of 1 to 20% by weight of said replenisher. In a second specific system, said first inorganic alkaline compound is sodium silicate or potassium silicate and has a concentration of 0.5 to 10% by weight of the developer, and said second inorganic alkaline compound is sodium hydroxide or potassium hydroxide with a concentration of 0.1 to 10% by weight of said replenisher. In a third specific system, said first inorganic alkaline compound is sodium hydroxide or potassium hydroxide with a concentration of 0.04 to 1% by weight of the developer, said second inorganic alkaline compound is sodium hydroxide or potassium hydroxide with a concentration of 0.1 to 10% by weight of said replenisher. Here the concentration includes both sodium silicate and potassium silicate, or both sodium hydroxide and potassium hydroxide, if both presents.

The developer in the developer tank of a developing processor is preferably maintained at a substantially constant temperature. A heater and/or chiller, preferably both a heater and a chiller, is preferably installed to maintain such a developer temperature. The temperature setting depends on the particular plate, developer, and processing condition. Preferably, the temperature is set around or slightly above room temperature, more preferably between 15° C. and 40° C., and most preferably between 20° C. and 30° C. The term substantially constant temperature means the temperature is maintained within 4° C. (4° C.) of the set temperature, preferably within 2° C. (±2° C.), and more preferably within 4° C. (±1° C.) during plate processing.

The plate exposed off press can be rinsed with water to remove the overcoat without developing the photosensitive layer before development. Such a process is called pre-wash. For plate developed off press, after development, the plate can be applied with a plate finisher, such as gum arabic, to improve the hydrophilicity of the substrate in the background areas.

The laser exposed plate can be directly developed, without preheating. In another embodiment, the laser exposed plate is overall heated to an elevated temperature before development to enhance certain performance characteristics of the plate, such as to finisher harden the exposed areas of the photosensitive layer. Such a heating process (after exposure and before development) is called preheat. Preferably, the preheat is capable of causing further hardening of the exposed areas of the photosensitive layer. The preheat condition is preferably 50 to 200° C. for 1 to 600 seconds, more preferably 70 to 140° C. for 1 to 300 seconds, and most preferably 90 to 120° C. for 1 to 60 seconds. The plate can be heated by any method that does not cause hardening of the photosensitive layer in the nonexposed areas. Suitable heating methods include, for example, hot air, contacting with a heated material such as a metal board, or applying an infrared radiation. It is noted that the plate temperature usually changes dramatically during the heating process (such as in the heating oven or passing through a heating unit). For development process including a step of washing off the overcoat with water before development, it is preferred that the preheat is performed before washing off the overcoat.

For off-press development, the development as well as the preheat and pre-wash can be carried out by hand or on a development processor. Preferably, the development is carried out on a developing processor. More preferably, all the process steps after laser exposure and before printing on press are carried out on a developing processor. The developing processor can perform the functions of preheat, pre-wash with water, development with a liquid developer, rinse with water, gumming with a plate finisher, and drying. One or more of the steps, such as preheat or gumming, may be eliminated for certain plate of this invention (depending on, for example, the specific photosensitive layer or substrate).

For visible or ultraviolet laser sensitive plates (including violet laser sensitive plates), or for thermosensitive plates with high sensitivity to white light (such as a plate which becomes non-developable after exposure to regular room light for 30 minutes or shorter), the laser exposure and development are preferably performed under a yellow-red light, more preferably a safe light with no substantial radiation below a certain cutoff wavelength (such as an orange light with a cutoff wavelength of 550 nm or a yellow light with a cutoff wavelength of 450 nm), or in substantial darkness such as in a light-tight box. Here, the term yellow-red light means a yellow light, a red light, or a light with color between yellow and red such as orange light. The term "substantial" means at least 99% reaching the ideal or normal condition; for example, "substantial darkness" means the light intensity is less than 1% of the light intensity with a 100-watt regular white incandescent lamp at 1 meter, and "no substantial radiation below 450 nm" means the light intensity below 450 nm is less than 1% of the light intensity below 450 nm for a 100-watt regular white incandescent lamp at 1 meter. The developed plate can be handled under any light, including white light. For plate developed on press, the press is preferably under a yellow-red room light or in substantial darkness for at least a portion (by time) of said on-press development, and is preferably under white light for at least a portion (by time) of said lithographic printing; more preferably, said press is under a yellow-red room light (which contains primarily light with wavelengths of above 450 nm and is substantially free of light with wavelengths of below 450 nm) for said on-press development, and is under white light (with a white light source on, and with or without a yellow-red light source also being turned on) for said lithographic printing.

The laser exposed plate can be treated with a deactivating agent to deactivate the photo hardening capability of the photosensitive layer so that said photosensitive layer in the non-hardened areas becomes incapable or having reduced rate of hardening (preferably incapable of hardening) under regular room light. The deactivated plate can be handled under white light for longer time or for as long as needed (preferably for as long as needed) before and during development. Such deactivation process is especially useful for on-press developable plate which is sensitive to the room light and is imagewise exposed off press. Examples of deactivation processes are described in U.S. patent application Ser. Nos. 11/266,817, 11/356,911, 11/728,648, 11/787,878 and 11/800,634, the entire disclosures of which are hereby incorporated by reference.

The deactivating agent can be any material that can deactivate the photo hardening capability of the photosensitive layer so that said photosensitive layer in the non-hardened areas becomes incapable or having reduced rate of hardening (preferably incapable of hardening) under regular room light. It can be a solid or liquid organic or inorganic compound, such as organic or inorganic acid, base, oxidizer, or reducer. The deactivating agent can be applied from a solution (based on water or organic solvent) to the photosensitive layer (with or without overcoat). Preferably, the deactivating agent is soluble in water and is applied from an aqueous solution. A water-soluble organic solvent, such as ethylene glycol, can be added into the aqueous solution. Certain additives, such as dye, dispersed pigment, bactericide, stabilizer, reducer, thickening agent, and surfactant, can be added. For free radical polymerizable photosensitive layer, the deactivating agent can be a compound that can react with a component of the free radical initiating system (such as initiator, sensitizing dye, or hydrogen donor).

The solution containing the deactivating agent can be applied to the photosensitive layer of the plate through any means, such as spray, dipping, roller coating, slot coating, etc. For plate with an overcoat, the deactivating solution can be applied with or without the overcoat being removed first. When the overcoat is not removed before applying the deactivating solution, the deactivating solution may penetrate through the overcoat without removing the overcoat, or partially or completely remove the overcoat.

For photosensitive layer having an amine group in the initiator, sensitizing dye, or hydrogen donor, an acid compound (including organic acid and inorganic acid) can be used as the deactivating agent. Suitable organic acids include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as carboxylic acid-functional organic compounds, phosphoric acid, and boric acid. Water-soluble organic compounds having at least one carboxylic acid group are preferred organic acids. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as aqueous solution to deactivate the photosensitive layer. When strong acid (such as hydrochloride acid) is used as deactivating agent, it is preferably diluted to low concentration (such as less than 0.5%, preferably less than 0.1% by weight) in an aqueous solution to apply to the plate so that it does not damage the plate or cause safety problem.

Alkaline compound can also be used as the deactivating agent for certain free radical polymerizable photosensitive layer because it can react with certain free radical initiating system (initiator, sensitizing dye, or hydrogen donor). For example, an alkaline compound can react with a hydrogen donor having caboxylic acid or thiol group. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem.

The on-press developable plate is usually exposed on an exposure device, and then mounted on press to develop with ink and/or fountain solution and then print out regular printed sheets. However, the plate can also be exposed on a printing press (such as by mounting on the plate cylinder or sliding through a flatbed imager mounted on the press, preferably by mounting on the plate cylinder), and the exposed plate can be directly developed on press with ink and/or fountain solution and then print out regular printed sheets. The ink and/or fountain solution-solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions. The plate may be rinsed or applied with an aqueous solution, including water and fountain solution, to remove the water soluble or dispersible overcoat and/or to dampen without developing the plate, after imagewise laser exposure and before on-press development with ink and/or fountain solution.

The ink and fountain solution may be applied at any combination or sequence, as needed for the plate; there is no particular limitation. For conventional wet press, usually fountain solution is applied (to contact the plate) first, followed by contacting with ink roller; preferably, fountain solution is applied to the plate first to dampen without removing the photosensitive layer, followed by contacting with ink to remove the non-hardened areas of the photosensitive layer. For press with integrated inking/dampening system, the ink and fountain solution are emulsified by various press rollers before being transferred to the plate as emulsion of ink and fountain solution.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic and oleophilic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

For off-press development with ink and/or fountain solution, or with an oleophilic paste (including liquid) and/or an aqueous solution, a developing device which carries ink and/or fountain solution, or an oleophilic paste and/or an aqueous solution, can be used. Preferably, the plate is developed with (i) ink, (ii) both ink and fountain solution, (iii) an oleophilic paste, or (iv) both an oleophilic paste and an aqueous solution; and the device carries corresponding developing fluid or fluids (i, ii, iii, or iv). For plate developable with ink, a regular ink or single-fluid ink can be used. For plate requiring more than one developing fluid (including paste), the ink (or oleophilic paste) and the fountain solution (or the aqueous solution) can be applied by any means and at any sequence or combination. The same developing fluid may be applied more than once (such as from different rollers), and different compositions of the same type of fluid (such as different aqueous solutions) can be used in the same developing device. Preferably, the fountain solution or the aqueous solution is applied first (for example, by spray, dipping, roller coating, or slot coating) to dampen the plate, followed by applying ink or an oleophilic paste (for example, with one or more ink rollers) to remove the photosensitive layer in the non-hardened areas. More preferably, the ink (or oleophilic paste) is applied from at least one ink roller (or any elastic roller) and the photosensitive layer in the non-hardened areas is carried away with the ink (or oleophilic paste) on the ink roller (or any elastic roller). After applying ink (or oleophilic paste), the plate may be further applied with fountain solution (or aqueous solution) or a gum solution (plate finisher), to further clean the background areas and/or to protect the lithographic surface of the plate. For plate with a water soluble or dispersible overcoat, the overcoat can be removed by contacting with fountain solution or the aqueous solution during the off-press development. Alternatively, the overcoat can be removed by rinse with water or other aqueous solution in a separate step before the development.

The oleophilic paste can be any paste or liquid with at least one water-insoluble organic solvent or oil as the main solvent, which can dissolve or disperse (and therefore develop) the photosensitive layer of this invention. Ink is one of such materials. The oleophilic paste may or may not contain pigment or dye. The oil can be a petroleum oil, vegetable oil, animal oil, or synthetic oil. The aqueous solution can be any water-based solutions that can dampen the substrate surface of the plate, or can be water. Fountain solution is one of such aqueous solutions. The aqueous solution can be neutral, slightly acidic, or slightly basic, preferably with a pH of 2.0 to 9.0, more preferably 3.0 to 8.0, and most preferably 4.0 to 7.0.

The methods as described in U.S. patent application Ser. Nos. 11/057,663, 11/175,518, 11/336,132, 11/356,911, 11/453,522, 11/504,561, 11/595,468, and 11/944,204, the entire disclosure of which is hereby incorporated by reference, can be used for the lithographic printing plates of this instant application.

The invention is further illustrated by the following non-limiting examples of its practice. Unless specified, all the values are by weight.

EXAMPLES 1-5

Five sheets of electrochemically grained, anodized, and polyvinyl phosphonic acid treated aluminum substrates were coated with photosensitive layer formulations PS-1 to PS-5 (as listed in Table 1), respectively, with a#8 Mayer rod, followed by hot air blow drying and baking in an oven at 110° C. for 1 min.

TABLE 1

(all values are by weight)

| Component | PS-1 | PS-2 | PS-3 | PS-4 | PS-5 |
|---|---|---|---|---|---|
| Carboset 527 (Alkaline soluble polymeric binder with acid No. of about 80, from B. F. Goodrich) | 2.81 | 2.10 | 1.40 | 0.70 | |
| Neocryl B-728 (Alkaline insoluble polymeric binder from Zeneca) | | 0.70 | 1.40 | 2.10 | 2.81 |

TABLE 1-continued (all values are by weight)

| Component | PS-1 | PS-2 | PS-3 | PS-4 | PS-5 |
|---|---|---|---|---|---|
| Ebecryl 220 (Blend of a hexafunctional urethane acrylate monomer and a tetrafunctional non-urethane acrylate monomer from UCB Chemicals) | 7.40 | 7.40 | 7.40 | 7.40 | 7.40 |
| Ebecryl 150 (Difunctional acrylate monomer from UCB Chemicals) | 0.51 | 0.51 | 0.51 | 0.51 | 0.51 |
| Renol Blue B2G-HW (60 parts blue pigment dispersed in 40 parts polyvinylbutyral from Ciba) | 0.69 | 0.69 | 0.69 | 0.69 | 0.69 |
| 2,2'-Bis(2-chlorophenyl)-4,4',5,5'-tetraphenyl-1,1'-biimidazole | 1.53 | 1.53 | 1.53 | 1.53 | 1.53 |
| 4,4'-Bis(diethylamino)benzophenone | 0.88 | 0.88 | 0.88 | 0.88 | 0.88 |
| 2-Mercaptobenzoxazole | 0.18 | 0.18 | 0.18 | 0.18 | 0.18 |
| 1-Methoxy-2-propanol | 60.20 | 60.20 | 60.20 | 60.20 | 60.20 |
| 2-Butanone | 25.80 | 25.80 | 25.80 | 25.80 | 25.80 |

Each of the photosensitive layer coated plates was further coated with a water-soluble overcoat OC-1 using a #6 Mayer rod, followed by hot air blow drying and baking in an oven at 100° C. for 1 min. The above coating and drying were performed under red room light.

OC-1

| Component | Weight ratios |
|---|---|
| Airvol 203 (Polyvinyl alcohol from Air Products) | 15.0 |
| Triton X-100 (Surfactant from Chemistry Store.com) | 0.20 |
| Water | 85.0 |

The above coated plates were exposed with a violet laser imager equipped with a 60 mw laser diode emitting at about 405 nm (MAKO 8 from ECRM) at a dosage of 65 $\mu J/cm^2$. The exposed plates were processed on a plate processor (Raptor from Glunz & Jensen) equipped with a heating section, a pre-wash section, a developer tank containing an alkaline aqueous developer having 2.0% by weight of potassium silicate and 3.0% by weight of Triton X-100 (nonionic surfactant from Chemistry Store.com), a rinse section, a gumming section (with rotating rubber rollers delivering gum solution to the plate), and a drying section. The plate being processed on the processor was sequentially passed through the preheat section to be heated to a temperature of 110° C. (measured on the back of the plate by a thermal tape), prewashed with water to rinse off the water-soluble overcoat, passed through the developer tank under brushing action of the rotating brushes to remove the non-hardened areas of the photosensitive layer, rinsed with water, gummed with a plate finisher (KPG 850S from Kodak), and dried with hot air blow. The plates were under an orange room light (with Fuji Yellow FV30 lights from Encapsulate) during the imaging and development, and were kept in a light-tight box between handlings. The developed plates were evaluated for the imaging resolution, with the results listed in Table 2.

TABLE 2

| | Plate | | | | |
|---|---|---|---|---|---|
| | #1 | #2 | #3 | #4 | #5 |
| Photosensitive layer | PS-1 | PS-2 | PS-3 | PS-4 | PS-5 |
| Highlight resolution | 5% | 2% | 1% | Not developed | Not developed |

EXAMPLES 6-8

Three sheets of electrochemically roughened, anodized, and polyvinyl phosphonic acid treated aluminum were first coated with a 0.1% aqueous solution of polyvinyl alcohol (Celvol 540, from Celanese) with a #6 Meyer rod, followed by drying in an oven at 100° C. for 2 min. The polyvinyl alcohol coated substrates were further coated with photosensitive layer formulations PS-6 to PS-8 (as listed in Table 3), respectively, with a #6 Mayer rod, followed by hot air blow drying and baking in an oven at 90° C. for 2 min.

TABLE 3

| (all values are by weight) | | | |
|---|---|---|---|
| Component | PS-6 | PS-7 | PS-8 |
| Carboset 527 (Alkaline soluble polymeric binder with acid No. of about 80, from B. F. Goodrich) | 28.04 | 14.02 | 0.00 |
| Neocryl B-728 (Alkaline insoluble polymeric binder from Zeneca) | 0.00 | 14.02 | 28.04 |
| Ebecryl 220 (Blend of a hexafunctional urethane acrylate monomer and a tetrafunctional non-urethane acrylate monomer from UCB Chemicals) | 6.70 | 6.70 | 6.70 |
| Pluronic L43 (Nonionic surfactant from BASF) | 0.59 | 0.59 | 0.59 |
| 2,2'-Bis(2-chlorophenyl)-4,4',5,5'-tetraphenyl-1,1'-biimidazole | 1.19 | 1.19 | 1.19 |
| 4,4'-Bis(diethylamino) benzophenone | 0.48 | 0.48 | 0.48 |
| 2-Mercaptobenzoxazole | 0.24 | 0.24 | 0.24 |
| 2-Butanone | 62.76 | 62.76 | 62.76 |

Each of the photosensitive layer coated plates was further coated with a water-soluble overcoat OC-2 using a #6 Mayer rod, followed by hot air blow drying and baking in an oven at 100° C. for 2 min. The above coating and drying were performed under red room light and the plates were kept in a light-tight box during storage.

| OC-2 | |
|---|---|
| Component | Weight (g) |
| Airvol 203 (polyvinyl alcohol from Air Products) | 4.50 |
| Poly(N-vinylpyrrolidone) | 0.50 |
| Water | 95.00 |

The coated plates were evaluated for coating uniformity, with the results listed in Table 4. The plates were then exposed with a violet plate imager equipped with a 60 mw violet laser diode emitting at about 405 nm (MAKO-8 from ECRM) for a dosage of 65 μj/cm$^2$. Each of the exposed plates was tested on a wet lithographic press (AR Dick 360) under a red light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. Here, the plates were evaluated for coating uniformity, imaged, and on-press developed under an orange room light (with Fuji Yellow FV30 lights from Encapsulate) or a red room light (with a 25 watts incandescent light bulb from General Electric), and was kept in a light tight box between handlings; after rolled up to clean background on press, the plates were further printed under white room light. All the 3 plates rolled up to clean background under 20 impressions. The highlight resolutions are listed in Table 4.

TABLE 4

| | Plate | | |
|---|---|---|---|
| | #6 | #7 | #8 |
| Photosensitive layer | PS-6 | PS-7 | PS-8 |
| Coating uniformity | Uniform with little defects | Uniform with little defects | Less uniform with some dewets |
| Highlight resolution | 3% | 1% | 1% |

I claim:

1. A method of processing a lithographic printing plate comprising in order:

(a) providing a lithographic printing plate comprising (i) a substrate; and (ii) a photosensitive layer comprising an alkaline soluble polymeric binder, an alkaline insoluble polymeric binder, a polymerizable monomer, an initiator, and an infrared absorbing dye; wherein said photosensitive layer is capable of hardening upon exposure to an infrared laser having a wavelength selected from 750 to 1200 nm;

(b) imagewise exposing said plate with said laser to cause hardening of the photosensitive layer in the exposed areas;

(c) overall heating said plate to 50 to 200° C. for 1 to 600 seconds; and (d) developing said exposed plate to remove the non-hardened areas of said photosensitive layer.

2. The method of claim 1 wherein said plate is heated to 70 to 140° C. for 1 to 300 seconds after said laser exposure and before said development.

3. The method of claim 1 wherein said photosensitive layer in the non-hardened areas is soluble or dispersible in a non-alkaline aqueous developer having a pH of from 1.0 to 8.0, and said plate is developed with said non-alkaline aqueous developer to remove the non-hardened areas of the photosensitive layer.

4. The method of claim 1 wherein said photosensitive layer in the non-hardened areas is soluble or dispersible in an aqueous alkaline developer having a pH of from 9.0 to 13.5, and said plate is developed with said aqueous alkaline developer to remove the non-hardened areas of the photosensitive layer.

5. The method of claim 1 wherein said photosensitive layer in the non-hardened areas is soluble or dispersible in ink and/or fountain solution; and said plate is developed off press with ink and/or fountain solution or with an oleophilic paste and/or an aqueous solution.

6. The method of claim 1 wherein said photosensitive layer in the non-hardened areas is soluble or dispersible in ink and/or fountain solution; and said plate is developed with ink and/or fountain solution on a lithographic press.

7. The method of claim 1 wherein said monomer has at least 2 (meth)acrylate groups, said initiator is a free radical initiator, and said photosensitive layer is hardened through free radical polymerization.

8. The method of claim 1 wherein said alkaline soluble polymeric binder comprises both (meth)acrylate units and (meth)acrylic acid units in the main chain, and said alkaline insoluble polymeric binder comprises (meth)acrylate units in the main chain.

9. The method of claim 1 wherein the weight ratio of all the alkaline soluble polymeric binders to all the alkaline insoluble polymeric binders in said photosensitive layer is from 0.10 to 10.0.

10. The method of claim 1 wherein the weight ratio of all the alkaline soluble polymeric binders to all the alkaline insoluble polymeric binders in said photosensitive layer is from 0.20 to 5.0.

11. The method of claim 1 wherein said alkaline soluble polymeric binder has an acid number of at least 40 mg KOH/g, and said alkaline insoluble polymeric binder has an acid number of less than 35 mg KOH/g.

12. The method of claim 1 wherein said alkaline soluble polymeric binder has an acid number of at least 60 mg KOH/g, and said alkaline insoluble polymeric binder has an acid number of less than 20 mg KOH/g.

13. The method of claim 1 wherein said plate further comprises a water soluble or dispersible overcoat on said photosensitive layer.

* * * * *